(12) United States Patent
Kim et al.

(10) Patent No.: US 10,373,668 B2
(45) Date of Patent: Aug. 6, 2019

(54) MEMORY DEVICE SHARED BY TWO OR MORE PROCESSORS AND SYSTEM INCLUDING THE SAME

(71) Applicant: Samsung Electronics Co., Ltd., Suwon-si, Gyeonggi-do (KR)

(72) Inventors: Kwang Hyun Kim, Seongnam-si (KR); Ki Seok Oh, Seoul (KR)

(73) Assignee: Samsung Electronics Co., Ltd., Gyoenggi-do (KR)

( * ) Notice: Subject to any disclaimer, the term of this patent is extended or adjusted under 35 U.S.C. 154(b) by 25 days.

(21) Appl. No.: 15/477,382

(22) Filed: Apr. 3, 2017

(65) Prior Publication Data

US 2017/0337966 A1    Nov. 23, 2017

(30) Foreign Application Priority Data

May 20, 2016    (KR) .................. 10-2016-0062392

(51) Int. Cl.
*G06F 3/06*   (2006.01)
*G11C 11/406*   (2006.01)
*G06F 12/109*   (2016.01)

(52) U.S. Cl.
CPC ...... *G11C 11/40603* (2013.01); *G06F 3/0604* (2013.01); *G06F 3/0644* (2013.01); *G06F 3/0673* (2013.01); *G06F 12/109* (2013.01); *G11C 11/40615* (2013.01); *G11C 11/40618* (2013.01); *G11C 11/40622* (2013.01); *G06F 2212/1041* (2013.01); *G06F 2212/657* (2013.01); *Y02D 10/13* (2018.01)

(58) Field of Classification Search
CPC .... G06F 3/0604; G06F 3/0625; G06F 3/0644; G06F 3/0673; G06F 12/109; G06F 2212/1028; G06F 2212/1041; G06F 2212/657; G11C 11/40603; G11C 11/40615; G11C 11/40618; G11C 11/40622
USPC .................................. 711/106, 173
See application file for complete search history.

(56) References Cited

U.S. PATENT DOCUMENTS

| | | | |
|---|---|---|---|
| 6,496,888 B1 * | 12/2002 | Pole, II | G06F 1/32 710/110 |
| 6,504,785 B1 | 1/2003 | Rao | |
| 6,760,806 B2 | 7/2004 | Jeon | |

(Continued)

FOREIGN PATENT DOCUMENTS

| KR | 100437610 B1 | 6/2004 |
|---|---|---|
| KR | 100443909 B1 | 8/2004 |

(Continued)

*Primary Examiner* — Gary J Portka
(74) *Attorney, Agent, or Firm* — Harness, Dickey & Pierce, P.L.C.

(57) ABSTRACT

A common memory device shared by a first processor and a second processor is provided. The common memory device includes a memory cell array including a first memory region allocated for the first processor and a second memory region allocated for the second processor, a refresh masking information storage circuit configured to store refresh masking information indicating whether a refresh is performed on at least one of the first and second memory regions, and a refresh circuit configured to selectively perform the refresh on the first memory region and the second memory region according to the refresh masking information.

12 Claims, 10 Drawing Sheets

(56) References Cited

U.S. PATENT DOCUMENTS

| | | | |
|---|---|---|---|
| 6,819,617 B2 | 11/2004 | Hwang et al. | |
| 7,290,080 B2 | 10/2007 | Patel | |
| 7,725,609 B2 | 5/2010 | Oh | |
| 8,051,264 B2 | 11/2011 | Jeong et al. | |
| 8,327,174 B2 | 12/2012 | Banga et al. | |
| 8,589,650 B2 | 11/2013 | Yokoya et al. | |
| 9,191,823 B2 | 11/2015 | Rieger et al. | |
| 2009/0144509 A1 | 6/2009 | Wong et al. | |
| 2010/0161929 A1* | 6/2010 | Nation | G06F 9/5016 711/170 |
| 2010/0318725 A1* | 12/2010 | Kwon | G06F 11/1441 711/103 |
| 2013/0100755 A1 | 4/2013 | Youn et al. | |
| 2014/0196140 A1* | 7/2014 | Gong | H04L 67/104 726/10 |

FOREIGN PATENT DOCUMENTS

| | | | |
|---|---|---|---|
| KR | 2011/0130435 A | 12/2011 | |
| KR | 2013/0044129 A | 5/2013 | |

\* cited by examiner

| OP[n] | Size of First Memory Region |
|---|---|
| 0 | 64MB |
| 1 | 128MB |
| 2 | 256MB |
| 3 | 512MB |
| ... | ... |

MEMORY DEVICE SHARED BY TWO OR MORE PROCESSORS AND SYSTEM INCLUDING THE SAME

CROSS-REFERENCE TO RELATED APPLICATION

This U.S. non-provisional application claims the benefit of priority under 35 U.S.C. § 119(a) to Korean Patent Application No. 10-2016-0062392, filed on May 20, 2016, the entire disclosure of which is hereby incorporated by reference in its entirety.

BACKGROUND

Various example embodiments of the inventive concepts relate to a memory device, memory device system, method of operating a memory device, and/or a non-transitory computer readable medium for operating a memory device, and more particularly, to a memory device shared by at least two processors and a refresh method thereof.

In typical mobile devices, such as smart phones and tablet personal computers (PCs), an application processor (AP) and a connectivity processor (CP) are implemented as separate integrated circuit (IC) chips as a two-chip architecture. In the two-chip architecture, a memory device for the AP is needed separate from a memory device for the CP. In other words, separate memories (e.g., RAM) are provided for both of the chips in the two-chip architecture.

Recently, one-chip architecture in which an AP and a CP are integrated into a single IC chip has been proposed, for example, as part of a System-on-Chip (SOC). In the one-chip architecture, the CP is embedded within the AP and a single memory device (e.g., RAM) is shared by the AP and the CP.

The one-chip architecture is more advantageous than the two-chip architecture in terms of providing a reduced size (e.g., area on a silicon wafer) and efficiency of configuration. However, because the entire storage area of the common memory device needs to be managed even when only one of the chips operates (e.g., when the CP operates, or the AP operates), the one-chip architecture is less efficient than the two-chip architecture in terms of optimization of power consumption.

SUMMARY

According to some example embodiments of the inventive concepts, there is provided a common memory device shared by at least a first processor and a second processor. The common memory device includes a memory cell array a plurality of memory regions including at least a first memory region allocated for the first processor and a second memory region allocated for the second processor, a refresh masking information storage circuit configured to store refresh masking information indicating whether a refresh operation is performed on at least one of the first and second memory regions, and a refresh circuit configured to selectively perform the refresh operation on the first memory region and the second memory region based on the refresh masking information.

According to other example embodiments of the inventive concepts, there is provided a shared memory system including a first processor, a second processor, and a common memory device shared by the first and second processors. The common memory device includes a memory cell array including a first memory region allocated for the first processor and a second memory region allocated for the second processor, a refresh circuit configured to perform a selective refresh operation on the first memory region and the second memory region based on refresh masking information indicating whether a refresh is to be performed on at least one of the first memory region and the second memory region.

According to other example embodiments of the inventive concepts, there is provided memory controller for a shared memory system. The memory controller may be configured to partition a memory device into a plurality of memory regions, each of the plurality of memory regions allocated to at least one of a first processor and a second processor, receive a command instruction from one of the first processor or the second processor, determine a memory region of the plurality of memory regions associated with the received command instructions using a mapping table, access the determined memory region in accordance with the received command instruction, and transmit results of the access to the processor issuing the received command instruction.

BRIEF DESCRIPTION OF THE DRAWINGS

The above and other features and advantages of the inventive concepts will become more apparent by describing in detail various example embodiments thereof with reference to the attached drawings in which.

DETAILED DESCRIPTION

Figure 1:
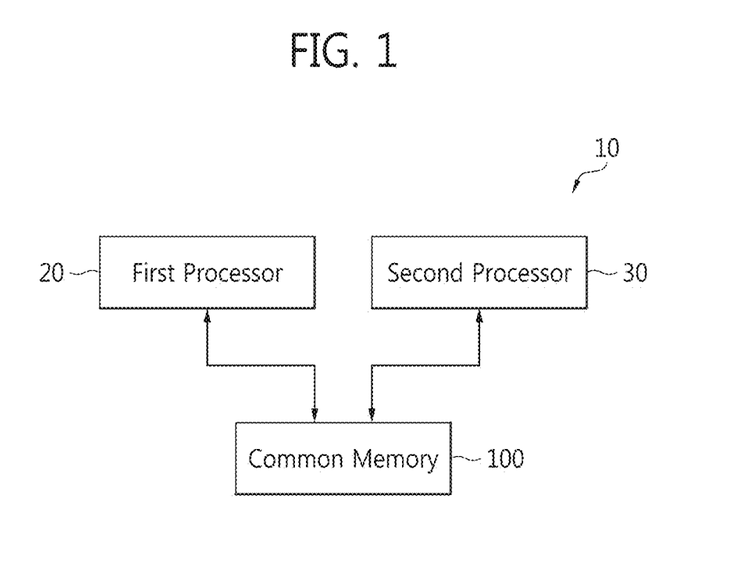
FIG. 1 is a schematic block diagram of a shared memory system according to some example embodiments of the inventive concepts.
Figure 2:
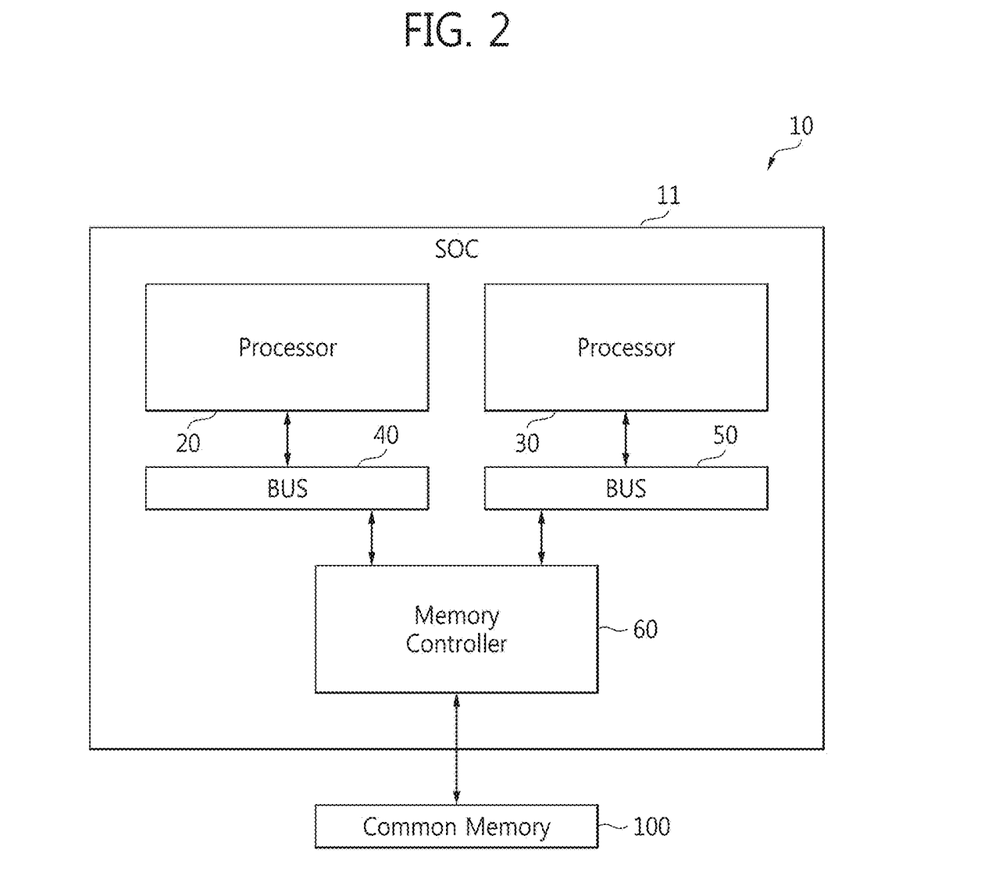
FIG. 2 is a detailed block diagram of the shared memory system illustrated in FIG. 1 according to at least one example embodiment of the inventive concepts.

FIG. 1 is a schematic block diagram of a shared memory system 10 according to some example embodiments of the inventive concepts. FIG. 2 is a detailed block diagram of the shared memory system 10 illustrated in FIG. 1 according to at least one example embodiment of the inventive concepts. Referring to FIGS. 1 and 2, the shared memory system includes at least two processors 20 and 30 and a common memory 100 shared by the at least two processors 20 and 30. Although only two processors 20 and 30 are illustrated in FIG. 1 for convenience's sake in the description, the number of processors sharing the common memory 100 may vary with example embodiments. For example, there may be more than two processors in the system according to other example embodiments.

The at least two processors 20 and 30 may be implemented in a single system-on-chip (SOC) 11, but is not limited thereto. The SOC 11 includes the first processor 20, the second processor 30, and a memory controller 60, etc.

The first and second processors 20 and 30 may access the common memory 100 through the memory controller 60. In other words, the memory controller 60 may perform interfacing between the common memory 100 and each of the first and second processors 20 and 30. Each of the first and second processors 20 and 30 may include at least one processing core.

The common memory 100 is main memory used in common by the first and second processors 20 and 30. The common memory 100 may be volatile memory, e.g., dynamic random access memory (DRAM), static random access memory (SRAM), etc., but is not restricted thereto.

The first or second processor 20 and/or 30 may send a memory access request, i.e., a data write request and/or a data read request to the memory controller 60. A first bus 40 may support data transmission between the first processor 20 and the memory controller 60. A second bus 50 may support data transmission between the second processor 30 and the memory controller 60. The first and second buses 40 and 50 may comply with the advanced microcontroller bus architecture (AMBA), advanced extensible interface (AXI) specification, etc., but the inventive concepts are not restricted to these examples. The first and second buses 40 and 50 may comply with other interconnect specifications.

Additionally, for example, the first processor 20 may demodulate and decode a signal (e.g., a downlink signal) received via wireless and/or wired communication and may store decoded data in the common memory 100 through the memory controller 60, but is not limited thereto. The first processor 20 may also generate packet data (e.g., internet protocol (IP) packet data) which includes the decoded data in a desired and/or predetermined format. The packet data including the decoded data may be stored in the common memory 100.

The first processor 20 may also encode and modulate data (e.g., uplink data) to be transmitted via wireless and/or wired communication into a wireless and/or wired signal suitable to be transmitted through wireless and/or wired communication. The first processor 20 may be referred to as a connectivity processor (CP) or a baseband (BB) processor, but is not limited thereto. In other example embodiments, the first processor 20 may be other types of processors, such as a general purpose processor, an application processor, a graphics processor, a math processor, a sound processor, an image processor, etc.

The second processor 30 may control the overall operation of the shared memory system 10. The second processor 30 may be an application processor (AP), but is not limited thereto, such as a CP or BB processor, a general purpose processor, a graphics processor, a math processor, a sound processor, an image processor, etc. The first processor 20 and/or the second processor 30 may be implemented as multi-core processors. The multi-core processor is a single computing component with two or more independent actual processors (referred to as "processing cores" or "cores"). Each of the processors may read and execute program instructions from memory, such as the common memory 100 or from a cache (not shown), etc.

In at least one example embodiment, the second processor 30 may read and process data stored in the common memory 100, such as downlink data stored in the common memory 100, e.g., packet data generated by the first processor 20. In other words, the first or the second processor 20 and 30 may read, modify, and/or write (e.g., process) data that was previously written and/or accessed, or will be accessed, overwritten, and/or deleted, by the other processor. For example, the second processor 30 may also generate and store data (e.g., packet data) to be transmitted through wireless (and/or wired) communication in the common memory 100. The first and/or second processors 20 and 30 may be disabled, powered off, and/or entered into a sleep mode according to (e.g., based on) the operating scenario, operating system (OS), and/or a computer program of the shared memory system 10 according to at least one example embodiment of the inventive concepts.

Figure 3:
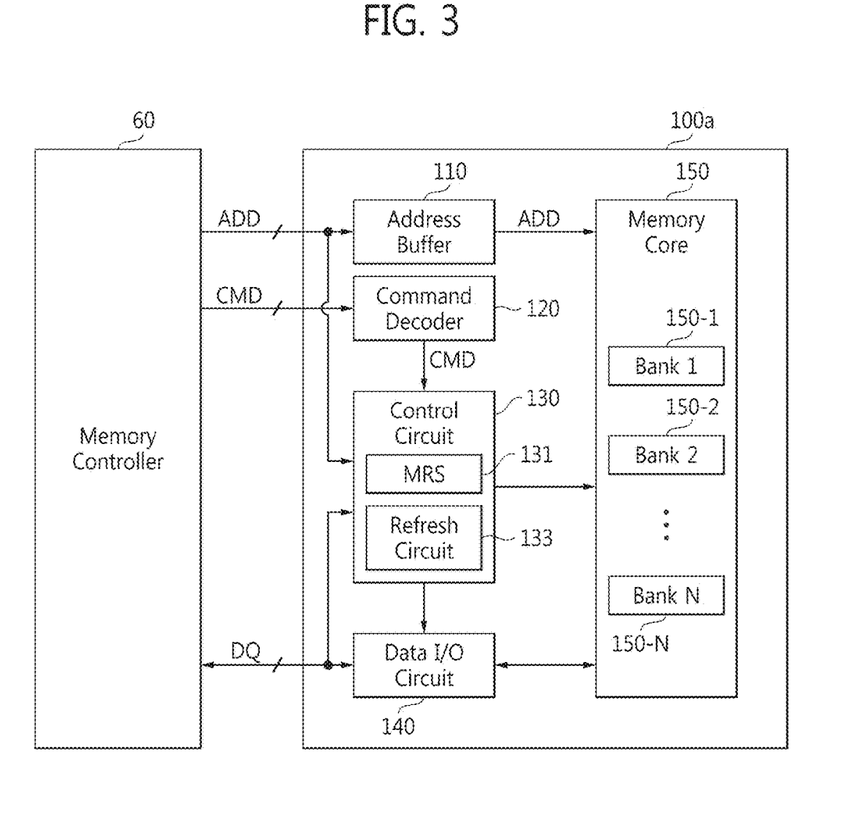
FIG. 3 is a block diagram of a common memory device according to some example embodiments of the inventive concepts.

FIG. 3 is a block diagram of a common memory device 100a according to some example embodiments of the inventive concepts. Referring to FIG. 3, the common memory device 100a may include an address buffer 110, a command decoder 120, a control circuit 130, a data input/output (I/O) circuit 140, and a memory core 150, but is not limited thereto. The common memory device 100a may have a memory cell array structure which can be partitioned into a plurality of memory regions. According to at least one example embodiment, the common memory device 100a may have a scheme for controlling the memory regions to operate independently from each other, for example one or more of the memory regions may be assigned to the first processor 20, the second processor 30, or both processors, etc.

The address buffer 110 may receive address information ADD from the memory controller 60, may temporarily store the address information ADD, and may transmit the address information ADD to the memory core 150 according to control signals received from the control circuit 130. The command decoder 120 may receive a command CMD from the memory controller 60, may decode the command CMD, and may provide the decoded command CMD to the control circuit 130.

The control circuit 130 may control the overall operation of the common memory device 110a in accordance with the address information ADD and the decoded command CMD. The control circuit 130 may control a plurality of memory regions to operate independently from each other. In other words, separate address and command operations may be performed on each of the plurality of memory regions. The control circuit 130 may include a refresh masking information storage circuit and a refresh circuit 133, but is not limited thereto. The refresh masking information storage circuit may be a mode register set (MRS) circuit 131, for example, but is not limited thereto.

The MRS circuit 131 may set a mode register in response to an MRS setting command received from the memory controller 60 via the command decoder 120 by storing size information of at least one memory region in response to the MRS setting command. The MRS circuit 131 may also store refresh masking information (e.g., self-refresh masking information) regarding at least one memory region in response to the MRS setting command received from the memory controller 60. The refresh masking information may be information indicating whether a refresh is performed on at least one memory region.

The refresh circuit 133 may control a refresh to be selectively performed on a memory region according to the refresh masking information. The refresh circuit 133 may perform a refresh operation in response to a refresh command such as self-refresh or auto-refresh. Here, the self-refresh will be described as an example and the refresh circuit 133 is not limited thereto.

The refresh circuit 133 may perform a self-refresh on one or more of the plurality of memory regions except for at least one restricted memory region based on the received self-refresh masking information. For instance, the refresh circuit 133 may be restricted from performing a self-refresh on a memory bank belonging to a masked memory region, but may perform the self-refresh on one or more memory banks associated with at least one unmasked memory region. Additionally, the refresh circuit 133 may be restricted from performing a self-refresh on at least one memory segment belonging to a masked memory region, but may perform the self-refresh on at least one memory segment belonging to at least one unmasked memory region.

In order to control a plurality of memory regions to be refreshed independently from each other, the refresh circuit 133 may include independent refresh circuits for each of the respective memory regions, but is not limited thereto. In other example embodiments, control of the plurality of memory regions may be provided by one or more refresh circuits that each control one or more memory regions of the plurality of memory regions. The memory core 150 may include one or more memory banks 150-1 through 150-N, where N is a natural number of at least 1.

The memory banks 150-1 through 150-N may have substantially the same structure and may operate in the same manner. For example, although not shown, the memory banks 150-1 through 150-N may include a memory cell array and an interface circuit (including, for example, a row decoder, a column decoder, and a write driver and sense amplifier circuit, etc.) which writes data to and reads data from the memory cell array. The memory cell array in each of the memory banks 150-1 through 150-N may include a plurality of memory blocks. Each of the memory blocks may be a group of memory cells having a desired and/or predetermined size.

The memory cell array includes word lines, bit lines, and memory cells. Each of the memory cells are connected to one of the word lines and one of the bit lines. Each of the memory cells may electrically store data of at least one bit. The memory cells may require a refresh (or refresh operation) to maintain data stored therein. The memory cells may be DRAM cells, synchronous DRAM (SDRAM) cells, or SRAM cells, but are not restricted thereto. The cells may also he magnetic RAM (MRAM) cells, ferroelectric RAM (FeRAM) cells, phase-change RAM (PRAM) cells, thyristor RAM (TRAM) cells, or resistive RAM (RRAM or ReRAM) cells, etc., according to other example embodiments.

According to at least one example embodiment of the inventive concepts, the data I/O circuit 140 may transmit data DQ from the memory controller 60 to the memory core 150 and/or may transmit data as the data DQ from the memory core 150 to the memory controller 60 based on one or more control signals received from the control circuit 130.

The memory controller 60 may send various types of command CMD instructions to control the operation of the common memory device 100a, and may send the common memory device 100a address information ADD corresponding to and/or for designating a memory bank and a memory cell on which a read, write or refresh operation will be performed. In addition, the memory controller 60 may transmit write data as the data DQ to be written to the memory core 150 to the common memory device 100a and may receive read data as the data DQ to be processed by the first processor 20 and/or the second processor 30 from the common memory device 100a.

Figure 4A:
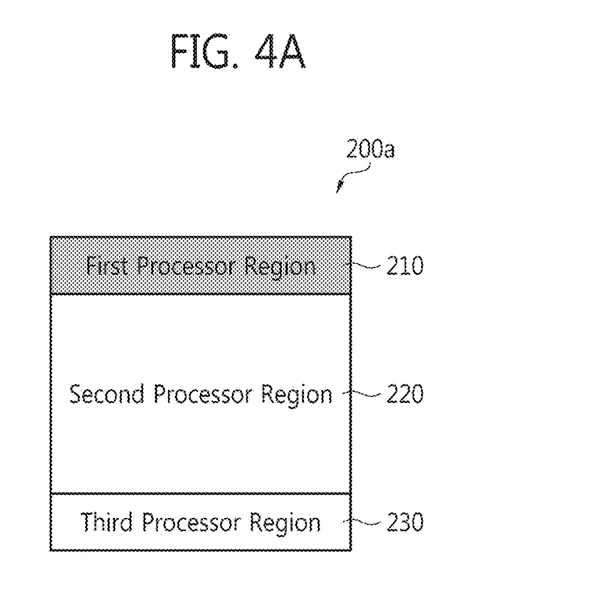
FIGS. 4A and 4B are diagrams for explaining memory area partitioning in a common memory device according to some example embodiments of the inventive concepts.
Figure 4B:
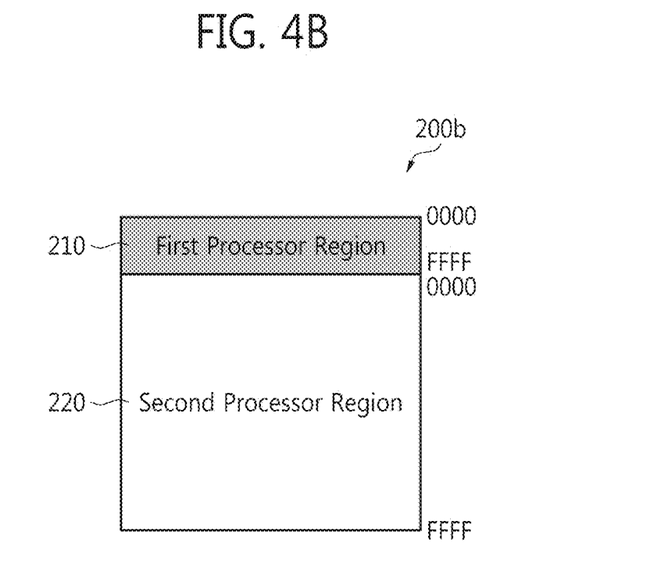

FIGS. 4A and 4B are diagrams for explaining memory area partitioning in a common memory device according to some example embodiments of the inventive concepts. Referring to FIGS. 4A and 4B, the common memory device 100a may be partitioned into at least two memory regions.

Referring to FIG. 4A, the memory area 200a (e.g., the entire memory cell array of the memory core 150) of the common memory device 100a may be partitioned into at least a first through third memory regions 210, 220, and 230, but is not limited thereto. According to at least one example embodiment, the first memory region 210 may be an independent memory region for the first processor 20 and the second memory region 220 may be an independent memory region for the second processor 30. The third memory region 230 may be a common region for both the first and second processors 20 and 30, may be an additional memory region for one of the first and second processors 20 and 30 (e.g., if one or more of the processors 20 and 30 are configured to execute a plurality of operating systems, one or more memory regions may be dedicated to each of the plurality of operating systems, or if one or more of the processors 20 and 30 include a plurality of cores, one or more memory regions may be dedicated to each of the plurality of cores, etc.), or may be allocated for at least one processor (not shown) other than the first and second processors 20 and 30. The number of partitioned memory regions may vary based on the number of processors, or may be independent of the number of processors included in the system.

Referring to FIG. 4B, a memory area 200b of the common memory device 100a is partitioned into the first and second memory regions 210 and 220 according to at least one example embodiment of the inventive concepts. For convenience's sake in the description, the first memory region 210 may be referred to as a first processor memory region and the second memory region 220 may be referred to as a second processor memory region, but they are not limited thereto.

The size of the first memory region 210 may be less than that of the second memory region 220, but is not limited thereto. For example, the size of the memory regions may be equal, or may be different from the other memory regions (e.g., the size of the first memory region 210 may be greater than the size of the second memory region 220, or if a third memory region is present, the size of the third memory region may be greatest, etc.). The size of each of the first and second memory regions 210 and 220 may be set (e.g., designated) by a host. The host may be either the first processor 20 and/or the second processor 30. Additionally, the host may be an operating system (OS) executing on the first or second processor 20 or 30.

Independent memory mapping is possible with respect to each of the first and second memory regions 210 and 220. For instance, a logical address space (e.g., from 0000 to FFFF) in the first processor 20 is mapped to (and/or corresponds to) a physical address space in the first memory region 210, and a logical address space (e.g., from 0000 to FFFF) in the second processor 30 is mapped to (and/or corresponds to) a physical address space in the second memory region 220, etc. Accordingly, each of the processors 20 and 30 may use the corresponding memory region 210 or 220 as a separate memory device. The host may also perform masking of one or more memory regions so that a self-refresh operation is not performed on one of the first and second memory regions 210 and 220, but is performed on the remaining memory regions.

Figure 5:
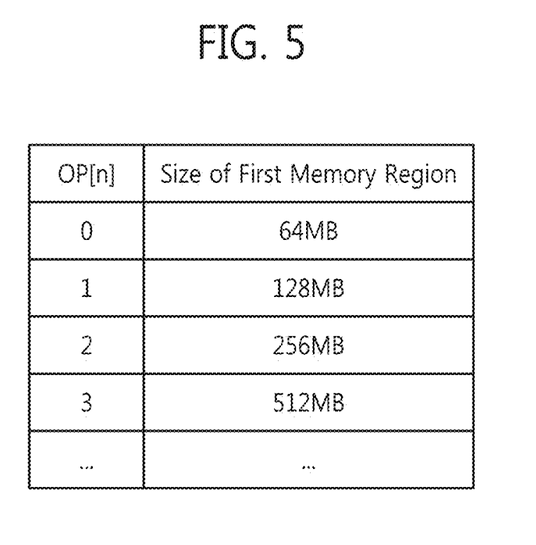
FIG. 5 is a flowchart diagram for explaining a method of setting the size of a memory region according to some example embodiments of the inventive concepts.

FIG. 5 is a diagram for explaining a method of setting the size of a memory region according to some example embodiments of the inventive concepts. Although the method of setting the size of only a first memory region is illustrated in FIG. 5, the example embodiments are not limited thereto and the size of additional memory regions, such as the second memory region, may also be set using a similar method.

The size of the first memory region may be selected from among a plurality of desired and/or predetermined sizes. For instance, a plurality of sizes that can be set for the first memory region may be predetermined, or may be configured according to a desired size of a host, a user, a system administrator, an OS, a software application, etc. Selecting one size from among the predetermined sizes and/or setting a desired size may be carried out using an MRS setting command transmitted by the processor associated with the host to the memory controller 60. The memory controller 60 may then transfer the MRS setting command to the command decoder 120, which then decodes the command and transfers the decoded command to the mode register set (MRS) circuit 131 in the control circuit 130. The MRS setting command may also include identification information regarding memory region and the at least one processor that is associated with the memory region. For instance, the size of the first memory region may be set to 64, 128, 256 or 512 MB by setting at least one desired and/or predetermined bit OP[n] of a mode register using the MRS setting command. Additionally, when the size of the first memory region is set, the size of the second memory region may automatically be determined to be the size of the remaining region excluding the first memory region, but the example embodiments are not limited thereto and the size of the second memory region, and any additional memory regions, may be set in a similar manner as the size of the first memory region.

Additionally, selecting one size from among the predetermined sizes and/or indicating a desired size may be carried from the memory controller 60 to the common memory device 100a using a combination of at least one pin among a plurality of pins of the common memory device 100a. The at least one pin may be selected from among an address pin, a data pin, and a command pin, or may be a separate pin other than the address pin, the data pin, and the command pin.

The memory controller 60 may store a mapping table that includes information regarding the independent memory mapping associated with each of the memory regions (e.g., first and second memory regions 210 and 220), the physical address spaces of each of the memory regions, the sizes of each of the memory regions, etc. When the memory controller 60 receives a command from one of the first and second processors 20 and 30, the memory controller 60 may translate the logical address space included with the command into the proper physical address space associated with the one or more memory regions associated with the processor issuing the command using the mapping table. Once the memory controller 60 has translated the original command from one of the processors, the memory controller 60 may transmit the translated command to the command decoder 120.

Figure 6A:
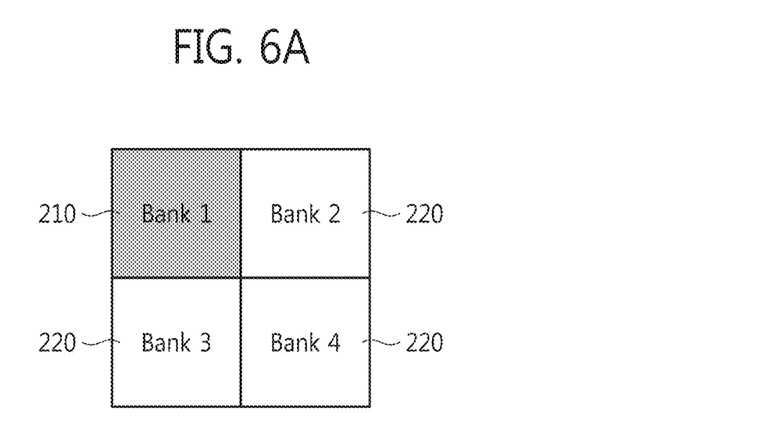
FIGS. 6A and 6B are diagrams for explaining the relationship between a memory region and a memory bank according to some example embodiments of the inventive concepts.
Figure 6B:
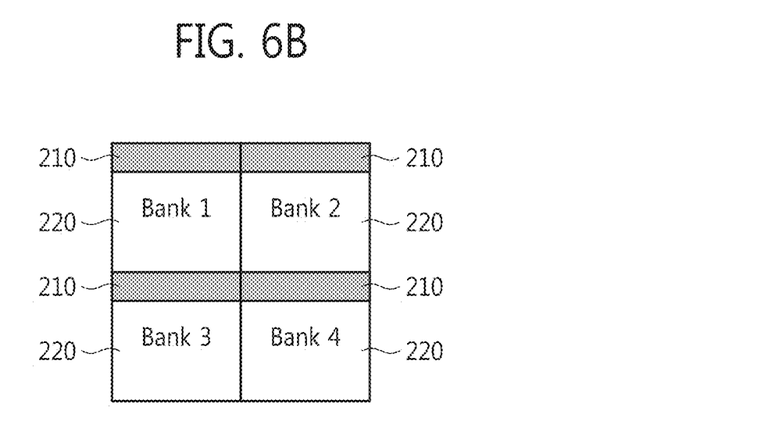

When the size of the first memory region and the size of the second memory region are set, the first and second memory regions may be controlled to operate independently from each other. FIGS. 6A and 6B are diagrams for explaining the relationship between a memory region and a memory bank according to some example embodiments of the inventive concepts.

Referring to FIG. 6A, the first and second memory regions 210 and 220 may be set such that at least one memory bank (e.g., Bank1) among a plurality of memory banks Bank1 through Bank4 is assigned to and/or belongs to the first memory region 210 and the remaining memory banks Bank2 through Bank4 are assigned to and/or belong to the second memory region 220. In the example embodiments illustrated in FIG. 6A, the number of memory banks belonging to the first memory region 210 may vary with the size of the first memory region 210 which has been set.

Since each of the memory banks Bank1 through Bank4 each include a row decoder, a column decoder, and a write driver and sense amplifier circuit, the memory bank Bank1 belonging to the first memory region 210 may operate independently from the memory banks Bank2 through Bank4 belonging to the second memory region 220. For instance, when a refresh operation of the second memory region 220 is masked, only the memory bank Bank1 belonging to the first memory region 210 may be controlled to perform a refresh operation.

Referring to FIG. 6B, the first and second memory regions 210 and 220 may be set such that a certain segment in each of the memory banks Bank1 through Bank4 belongs to one of the memory regions, such as the first memory region 210, and the remaining segments of the memory banks belong to a different memory region, such as the second memory region 220. Each segment may include at least one memory block.

In the example embodiments illustrated in FIG. 6B, the size of (e.g., the number of memory blocks in) a segment allocated to the first memory region 210 in each of the memory banks Bank1 through Bank4 may vary with the size of the first memory region 210 which has been set. For instance, when a refresh operation of the second memory region 220 is masked, a refresh operation may he controlled to be performed on only the segment belonging to the first memory region 210.

Figure 7:
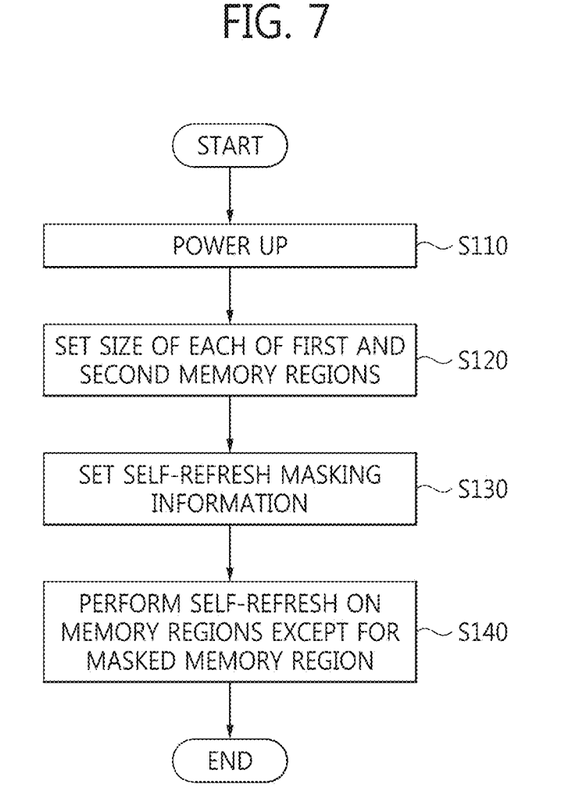
FIG. 7 is a flowchart of a method of operating a shared memory system according to some example embodiments of the inventive concepts.

FIG. 7 is a flowchart of a method of operating a shared memory system according to some example embodiments of the inventive concepts. The method illustrated in FIG. 7 may be performed by the shared memory system 10 illustrated in FIGS. 1 and 2 according to some example embodiments, but is not limited thereto.

Referring to FIGS. 1, 2, and 7, the shared memory system 10 is powered up in operation S110. According to the example embodiment illustrated in FIG. 7, when the shared memory system 10 is powered up, the second processor (e.g., an AP) 30 sets the size of at least one of the first and second memory regions 210 and 220 in operation S120.

As described above, the second processor 30 may set a desired size and/or may select one size from among a plurality of predetermined sizes using an MRS setting command. For instance, the second processor 30 may send the MRS setting command to the common memory device 100a through the memory controller 60. In response to the MRS setting command, the common memory device 100a may store size information in a mode register. Additionally, the second processor 30 may set the desired size and/or select one size from among a plurality of predetermined sizes using a particular pin of the common memory device 100a through the memory controller 60.

When the size of each of the first and second memory regions 210 and 220 is set, the memory area (e.g., the memory banks) is partitioned into the first memory region 210 and the second memory region 220 according to the sizes that have been set. Thereafter, a host may set self-refresh masking information in the common memory 100 according to whether either the first processor 20 and/or the second processor 30 is enabled in operation S130. The received self-refresh masking information indicates whether a self-refresh is performed on each of the first and second memory regions 210 and 220 according to at least one example embodiment. The self-refresh masking information may be set in the mode register.

The refresh circuit 133 of the common memory device 100a does not perform a self-refresh operation on a memory region that has been masked according to the self-refresh masking information, and performs the self-refresh operation on the remaining memory region that has not been masked in operation S140. For instance, when the second processor 30 is disabled, or in the sleep mode, etc., it may be set that a self-refresh of the second memory region 220 is not performed. Accordingly, when the second processor 30 is disabled and only the first processor 20 is enabled, a self-refresh is performed only on the first memory region 210 in the entire memory area of the common memory device 100a according to the control of the host. As a result, the power consumption of the common memory device 100a is reduced.

Figure 8:
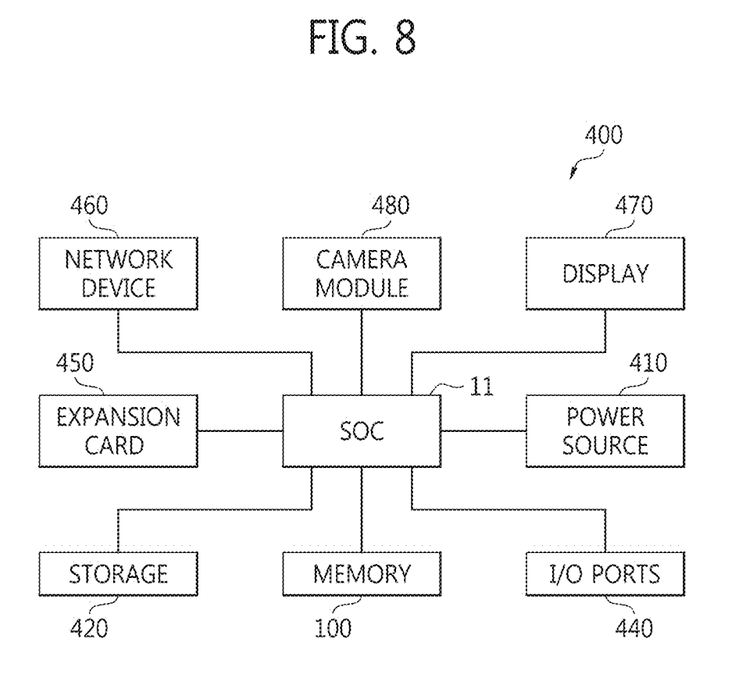
FIG. 8 is a block diagram of an electronic system according to some example embodiments of the inventive concepts.

FIG. 8 is a block diagram of an electronic system 400 according to some example embodiments of the inventive concepts. Referring to FIG. 8, the electronic system 400 may be implemented as a personal computer (PC), a data server, a laptop computer, a portable device, a smart device, an Internet of Things (IoT) device, a wearable device, a processing device, etc. The portable device may be a cellular telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, an e-book, a mobile internet device (MID), a virtual reality (VR) device, an augmented reality (AR) device, etc.

The electronic system 400 may include the SOC 11, a power source 410, a storage 420, the common memory 100, I/O ports 440, an expansion card 450, a network device 460, and a display 470, but is not limited thereto. The electronic system 400 may also include a camera module 480 and other modules.

The SOC 11 may control the operation of at least one of the elements 100 and 410 through 480. The SOC 11 corresponds to the SOC 11 illustrated in FIG. 2 according to some example embodiments.

The power source 410 may supply an operating voltage to at least one of the elements 100 and 420 through 480. The storage 420 may be implemented as a hard disk drive (HDD), a solid state drive (SSD), an optical drive, and/or other forms of non-volatile memory. The common memory 100 may be implemented as a volatile memory.

The I/O ports 440 receive data transmitted to the electronic system 400 or transmit data from the electronic system 400 to an external device. For instance, the I/O ports 440 may include a port for connection with an input device, such as a computer mouse, a microphone, a touchpad, etc., a port for connection with an output device, such as a printer, a projector, etc., a port for a wired data connection, such as a universal serial bus (USB) drive, etc.

The expansion card 450 may be implemented as a secure digital (SD) card, a multimedia card (MMC), etc. The expansion card 450 may be a subscriber identity module (SIM) card, a universal SIM (USIM) card, etc.

The network device 460 enables the electronic system 400 to be connected with a wired or wireless network. The display 470 displays data output from the storage 420, the common memory 100, the 110 ports 440, the expansion card 450, or the network device 460.

The camera module 480 is a module that can convert an optical image into an electrical image. Accordingly, the electrical image output from the camera module 480 may be stored in the storage 420, the common memory 100, or the expansion card 450. The electrical image output from the camera module 480 may also be displayed through the display 470.

Figure 9:
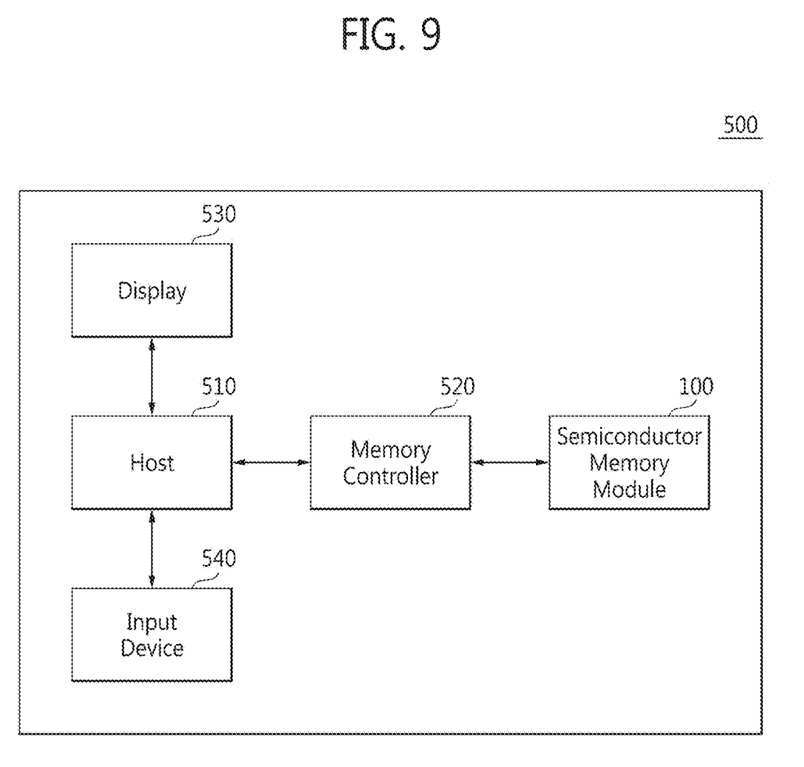
FIG. 9 is a block diagram of an electronic system including the common memory device illustrated in FIG. 1 according to some example embodiments of the inventive concepts.

FIG. 9 is a block diagram of an electronic system 500 including the common memory device 100 illustrated in FIG. 1 according to some example embodiments of the inventive concepts. The electronic system 500 may be implemented as a personal computer (PC), a tablet PC, a net-book, an e-reader, a personal digital assistant (PDA), a portable multimedia player (PMP), an MP3 player, an MP4 player, a smart device, an Internet of Things (IoT) device, a wearable device, a processing device, etc.

The electronic system 500 includes a host 510, the common memory device 100, a memory controller 520 controlling the data processing operations of the common memory device 100, a display 530 and an input device 540, but is not limited thereto and may include additional components.

The host 510 may display data stored in the memory device 100 through the display 530 according to data input through the input device 540. The input device 540 may be implemented by an input device such as a touch pad, a computer mouse, a keypad, a keyboard, etc.

The host 510 may control the overall operation of the electronic system 500 and the operations of the memory controller 520. The host 510 may include two or more processors that share the common memory device 100, and the memory controller 520 may be the memory controller 60 illustrated in FIG. 2.

According to some example embodiments, the memory controller 520, which may control the operations of the memory device 100, may be implemented as a part of the host 510 or as a separate chip.

Figure 10:
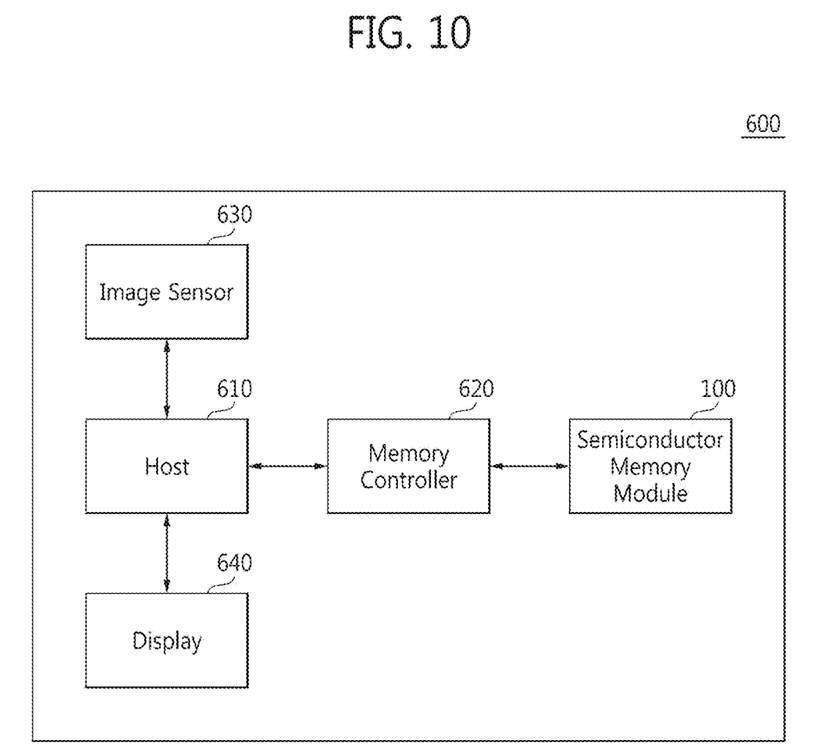
FIG. 10 is a block diagram of an electronic system including the common memory device illustrated in FIG. 1 according to some example embodiments of the inventive concepts.

FIG. 10 is a block diagram of an electronic system 600 including the common memory device 100 illustrated in FIG. 1 according to some example embodiments of the inventive concepts. The electronic system 600 may be implemented as an image processing device like a digital camera, a cellular phone equipped with a digital camera, a smart phone equipped with a digital camera, a VR device, an AR device, etc.

The electronic system 600 includes a host 610, the common memory device 100 and a memory controller 620 controlling the data processing operations, such as a write operation or a read operation, of the common memory device 100. The electronic system 600 further includes an image sensor 630 and a display 640, but is not limited thereto.

The image sensor 630 included in the electronic system 600 converts optical images into digital signals and outputs the digital signals to the host 610 or the memory controller 620. The digital signals may be controlled by the host 610 to be displayed through the display 640 or stored in the common memory device 100 through the memory controller 620.

Data stored in the common memory device 100 may be displayed through the display 640 according to the control of the host 610 or the memory controller 620. The memory controller 620, which may control the operations of the common memory device 100, may be implemented as a part of the host 610 or as a separate chip. The host 610 may include two or more processors that share the common memory device 100, and the memory controller 620 may be the memory controller 60 illustrated in FIG. 2.

As described above, according to some example embodiments of the inventive concepts, the memory area of a memory device shared by at least two processors is partitioned into at least two memory regions and a refresh operation is not performed (i.e., is masked) with respect to at least one of the memory regions according to enabling or disabling of each of the processors, so that power consumption is reduced.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

As is traditional in the field of the inventive concepts, various example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar processing devices, they may be programmed using software (e.g., microcode) to perform various functions discussed herein and may optionally be driven by firmware and/or software, thereby transforming the microprocessor or similar processing devices into a special purpose processor. Additionally, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

What is claimed is:

1. A common memory device shared by at least a first processor and a second processor, the common memory device comprising:
    a memory cell array including a plurality of memory regions, the plurality of memory regions including at least a first memory region allocated for the first processor and a second memory region allocated for the second processor, the memory cell array electrically connected to a memory controller, and the memory controller electrically connected to the first processor via a first local bus and electrically connected to the second processor via a second local bus;
    a refresh masking information storage circuit configured to store refresh masking information indicating whether a refresh operation is performed on at least one of the first and second memory regions; and
    a refresh circuit configured to,
        selectively perform the refresh operation on the first memory region and the second memory region based on the refresh masking information, and
        store self-refresh masking information in response to receiving a mode register setting command.

2. The common memory device of claim 1, wherein the refresh circuit is configured to not perform the refresh operation on the plurality of memory regions except for at least one of the first and second memory regions based on the refresh masking information.

3. The common memory device of claim 1, wherein when the second processor is disabled or in a sleep mode, the refresh masking information indicates that second memory region is masked.

4. The common memory device of claim 1, wherein the refresh masking information storage circuit is configured to further store size information of at least one of the first and second memory regions.

5. The common memory device of claim 1, wherein a size of the first memory region is selected from among a plurality of predetermined sizes.

6. The common memory device of claim 5, further comprising at least one pin configured to select the size of the first memory region from among the predetermined sizes.

7. The common memory device of claim 5, wherein
    a first logical address space associated with the first processor is mapped to a first physical address space associated with the first memory region; and
    a second logical address space associated with the second processor is mapped to a second physical address space associated with the second memory region.

8. The common memory device of claim 1, wherein
    the memory cell array includes a plurality of memory banks;
    at least one of the plurality of memory banks corresponds to the first memory region; and
    the remaining memory banks of the plurality of memory banks corresponds to the second memory region.

9. The common memory device of claim 1, wherein
    the memory cell array includes a plurality of memory banks, and each of the plurality of memory banks includes a plurality of segments;
    a desired segment in each of the plurality of memory banks corresponds to the first memory region; and
    the remaining segments in each of the plurality of memory banks corresponds to the second memory region.

10. A memory controller for a shared memory system, the memory controller configured to:
    partition a memory device into a plurality of memory regions, each of the plurality of memory regions allocated to at least one of a first processor and a second processor, the first processor electrically connected to the memory controller via a first local bus, and the second processor electrically connected to the memory controller via a second local bus;

receive a command instruction from one of the first processor or the second processor;

determine a memory region of the plurality of memory regions associated with the received command instructions using a mapping table;

access the determined memory region in accordance with the received command instruction; and transmit results of the access to the at least one of the first processor and the second processor issuing the received command instruction, wherein the received command instruction is a refresh operation command; and the controller is further configured to, partition the memory device by setting a size of at least one of the memory regions based on an instruction received from one of the first processor or the second processor, and cause the memory device to perform the refresh operation on the memory regions of the plurality of memory regions not indicated as being masked, based on masking information indicating a memory region of the plurality of memory regions to mask.

11. The memory controller of claim 10, wherein the plurality of memory regions includes at least a first memory region associated with the first processor and a second memory region associated with the second processor.

12. The memory controller of claim 10, wherein at least one of the memory regions of the plurality of memory regions is associated with both the first processor and the second processor.

* * * * *